(12) United States Patent
Su

(10) Patent No.: US 7,781,953 B2
(45) Date of Patent: Aug. 24, 2010

(54) LIGHT-EMITTING DEVICE WITH OPEN-LOOP CONTROL AND MANUFACTURING METHOD THEREOF

(75) Inventor: Hung-Yuan Su, Taipei (TW)

(73) Assignee: Lite-On Technology Corp., Taipei (TW)

( * ) Notice: Subject to any disclaimer, the term of this patent is extended or adjusted under 35 U.S.C. 154(b) by 691 days.

(21) Appl. No.: 11/785,223

(22) Filed: Apr. 16, 2007

(65) Prior Publication Data

US 2008/0231166 A1    Sep. 25, 2008

(30) Foreign Application Priority Data

Mar. 23, 2007    (TW) ............................... 96110186 A

(51) Int. Cl.
*H01J 1/62* (2006.01)
*H01J 63/04* (2006.01)
*C09K 11/06* (2006.01)

(52) U.S. Cl. ..................... 313/487; 313/483; 313/486; 313/498; 313/500; 313/501; 313/502; 313/503; 313/506; 252/301.16; 428/690; 428/917

(58) Field of Classification Search .................. None
See application file for complete search history.

(56) References Cited

U.S. PATENT DOCUMENTS 5,998,925 A    12/1999    Shimizu et al.

6,567,009 B2 *    5/2003    Ohishi et al. ........... 340/815.45
7,176,909 B2 *    2/2007    Koyama ..................... 345/204

FOREIGN PATENT DOCUMENTS

| TW | 481967 | 12/1989 |
|---|---|---|
| TW | 357384 | 6/1992 |
| TW | 200405238 | 4/2004 |
| TW | I156177 | 1/2005 |
| TW | I228841 | 3/2005 |
| TW | I245435 | 12/2005 |

* cited by examiner

*Primary Examiner*—Nimeshkumar D Patel
*Assistant Examiner*—Natalie K Walford
(74) *Attorney, Agent, or Firm*—Bacon & Thomas, PLLC

(57) ABSTRACT

A light-emitting device with open-loop control including a LED capable of emitting a blue light and a mix-light adjusting portion is provided. The mix-light adjusting portion includes a first and a second fluorescent material both capable of being excited by blue light. When the first and the second fluorescent material are excited by a short-wavelength blue light, the excitation intensity of the first fluorescent material is higher than that of the second fluorescent material. When the first and the second fluorescent material are excited by a long-wavelength blue light, the excitation intensity of the first fluorescent material is lower than that of the second fluorescent material. The peak wavelength of the emission of the first fluorescent material is smaller than that of the emission of the second fluorescent material. The dividing wavelength between the short-wavelength blue light and the long-wavelength blue light ranges from a first to a second wavelength.

8 Claims, 7 Drawing Sheets

LIGHT-EMITTING DEVICE WITH OPEN-LOOP CONTROL AND MANUFACTURING METHOD THEREOF

This application claims the benefit of Taiwan application Serial No. 96110186, filed Mar. 23, 2007, the subject matter of which is incorporated herein by reference.

BACKGROUND OF THE INVENTION

1. Field of the Invention

The invention relates in general to a light-emitting device and manufacturing method thereof, and more particularly to a light-emitting device with open-loop control and manufacturing method thereof.

2. Description of the Related Art

White light is a mixed light of several different color lights. Any white light visible to the naked eyes is a mixed light composed of at least two color lights with different wavelengths. For example, when one's naked eyes receive a red light, a green light and a blue light at the same time or by the blue light and a yellow light at the same time, the received light is perceived as a white light. There are three common light sources, namely, the fluorescent lamp with color temperature approximates to 7500K, the filament lamp with color temperature approximates to 3000K, and the white light emitting diode (LED) that is still under development.

There are five methods to manufacture the white light LED. According to the first method, three different currents respectively provided to three LEDs made from indium gallium aluminum phosphide (InGaAlP), gallium phosphide (GaP) and gallium nitride (GaN) are controlled to drive the three LEDs to emit a red light, a green light and a blue light, and then a white light is generated by mixing the three lights. According to the second method, two LEDs made from gallium nitride (GaN) and indium gallium aluminum phosphide (InGaAlP) respectively receive different currents that are controlled to drive the LEDs to emit a blue light and a yellowish green light or a green light and a red light, and further a white light is generated by mixing the two colored lights. According to the third method provided by the Nichia Chemical Ltd of Japan in 1996, a blue-light LED made from indium gallium nitride (InGaN) is combined with a yttrium aluminum garnet fluorescent powder that emits a yellow light, then the two color lights are mixed to generate a white light. The third method is disclosed in Taiwanese Patent Publication No. 1561771 and U.S. Pat. No. 5,998,925. According to the fourth method that provided by the Sumitomo Electric Industries Ltd of Japan in the January of 1999, a white light LED made from zinc selenide (ZnSe) is used. At first, a cadmium zinc selenide (CdZnSe) thin film is formed on a zinc selenide single chip substrate. The thin film emits a blue light when the thin film is provided with a current, meanwhile portion of the blue light projects to the substrate and emits a yellow light. Then the blue light and the yellow light that are complementary to each other are mixed to form a white light. According to the fifth method, a UV white light LED is used. A UV light is used to excite different fluorescent powders to generate different fluorescent lights, and then the fluorescent lights are further mixed to form a white light.

Above the five methods that are implemented to manufacture white light LEDs, the first method and the second method are able to automatically control the white light chromaticity coordinate by changing the currents to compensate the spectrum of the mixed light. The white light chromaticity coordinates generated according to the remaining three methods using fluorescent materials are easily affected by the color light emitted by the LEDs or the fluorescent materials, and are unable to automatically control the white light at a fixed chromaticity coordinate to compensate the spectrum of the mixed light. Despite the first method is able to adjust the currents of the three chips to compensate the spectrum of the mixed light and automatically control the white light chromaticity coordinate, the currents of the three chips need to be controlled respectively, making the control circuit even more complicated and costive. Despite the second method is also able to adjust the currents of the two chips to compensate the spectrum of the mixed light and automatically control the white light chromaticity coordinate, the problems that occur in the first method also occur in the second method.

SUMMARY OF THE INVENTION

The invention is directed to a light-emitting device with open-loop control and manufacturing method thereof. The light-emitting device is capable of automatically controlling the white light chromaticity coordinate without any additional control circuits. The light-emitting device makes a use of fluorescent materials that are chosen in advance, such that the white light chromaticity coordinate is fixed.

According to a first aspect of the present invention, a light-emitting device with open-loop control including a LED capable of emitting a blue light and a mix-light adjusting portion is provided. The mix-light adjusting portion includes a first fluorescent material and a second fluorescent material that are capable of being excited by blue light. When the first fluorescent material and the second fluorescent material are excited by a short-wavelength blue light, the excitation intensity of the first fluorescent material is higher than that of the second fluorescent material. When the first fluorescent material and the second fluorescent material are excited by a long-wavelength blue light, the excitation intensity of the first fluorescent material is lower than that of the second fluorescent material. The peak wavelength of the emission of the first fluorescent material is smaller than that of the emission of the second fluorescent material. The dividing wavelength between the short-wavelength blue light and the long-wavelength blue light ranges from a first wavelength to a second wavelength.

According to a second aspect of the present invention, a method of manufacturing a light-emitting device is provided. The method includes the following steps. Firstly, a LED capable of emitting a blue light, a first fluorescent material and a second fluorescent material are provided. Next, the emission intensity of the blue light emitted from the LED driven by a certain current and a first chromaticity coordinate are measured. Then, the first fluorescent material and the second fluorescent material are excited by the blue light, and a second chromaticity coordinate of the first fluorescent material and a third chromaticity coordinate of the second fluorescent material are measured. Afterwards, a white light chromaticity coordinate is set, and a mix-light chromaticity coordinate of the first fluorescent material and the second fluorescent material is obtained according to the white light chromaticity coordinate, the first chromaticity coordinate, the second chromaticity coordinate and third chromaticity coordinate. After that, the emission intensity of the first fluorescent material and the emission intensity of the second fluorescent material are obtained according to the mix-light chromaticity coordinate, the first chromaticity coordinate and the second chromaticity coordinate; and the ratio of the weight of the first fluorescent material to that of the second fluorescent material is determined according to the emission intensity of the first fluorescent material and the emission intensity of the second fluorescent material.

The invention will become apparent from the following detailed description of the preferred but non-limiting embodiments. The following description is made with reference to the accompanying drawings.

DETAILED DESCRIPTION OF THE INVENTION

Figure 1:
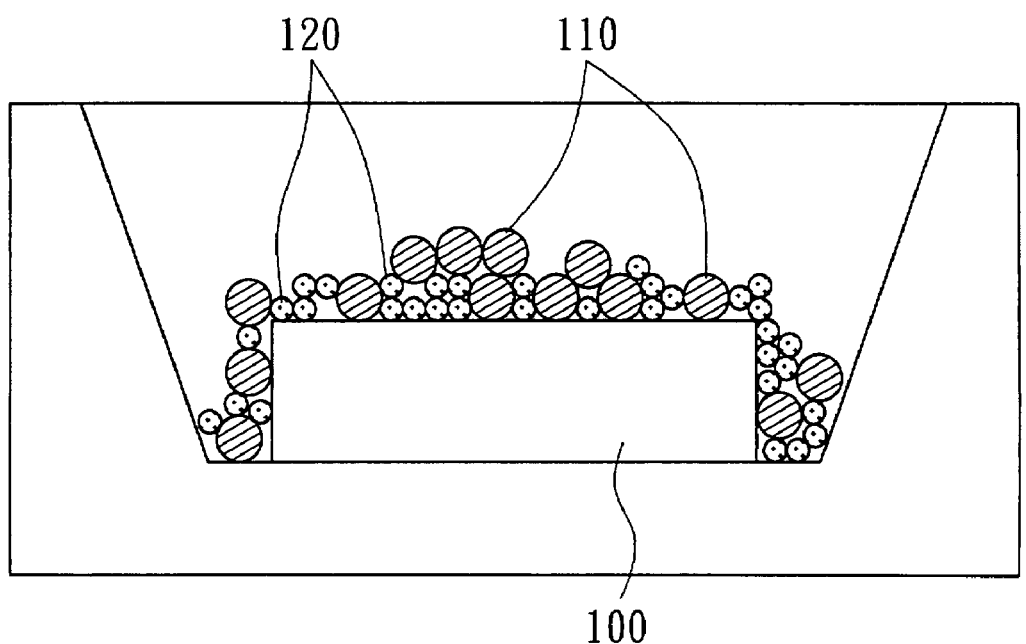
FIG. 1 is a perspective of a light-emitting device of the invention.
Figure 2:
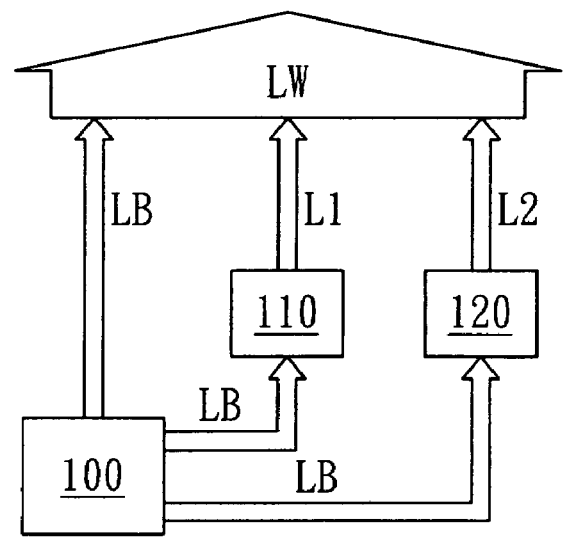
FIG. 2 is a system chart of the chromaticity coordinate control of the light-emitting device of FIG. 1.

Referring to FIG. 1~2. FIG. 1 is a perspective of a light-emitting device of the invention. FIG. 2 is a system chart of the chromaticity coordinate control of the light-emitting device of FIG. 1. As indicated in FIGS. 1~2, the light-emitting device 1 includes a light emitting diode (LED) 100 capable of emitting a blue light LB and a mix-light adjusting portion. The mix-light adjusting portion includes a first fluorescent material 110 and a second fluorescent material 120 that are capable of being excited by the blue light LB. The fluorescent material used in the present embodiment of the invention has the following characteristics. When the first fluorescent material 110 and the second fluorescent material 120 are excited by a short-wavelength blue light, the excitation intensity of the first fluorescent material 110 is higher than that of the second fluorescent material 120. When the first fluorescent material 110 and the second fluorescent material 120 are excited by a long-wavelength blue light, the excitation intensity of the first fluorescent material 110 is lower than that of the second fluorescent material 120. The peak wavelength of the emission of the first fluorescent material 110 is smaller than that of the emission of the second fluorescent material 120. The dividing wavelength between the short wavelength blue light and the long wavelength blue light of the excitation light source is within a predetermined wavelength range. Preferably, the dividing wavelength between the short wavelength blue light and long wavelength blue light is within the range of 440~480 nm.

The LED 110 and the mix-light adjusting portion form an open-loop system control. With the characteristics that the excitation intensity of the first fluorescent material 110 and the excitation intensity of the second fluorescent material 120 are affected by the wavelength of the exciting light, and that the peak wavelength of the emission of the first fluorescent material 110 is smaller than that of the emission of the second fluorescent material 120, when the wavelength of the blue light LB emitted from the LED 100 changes, the chromaticity coordinate of the mixed light (L1+L2) of the two fluorescent materials 110 and 120 will be automatically adjusted according to the wavelength of the blue light emitted from the LED 100, such that the chromaticity coordinate of the white light LW that is mixed by the lights (LB, L1, and L2) emitted from the LED 110, the first fluorescent material 110 and the second fluorescent material 120 is maintained at a fixed coordinate.

Figure 3:
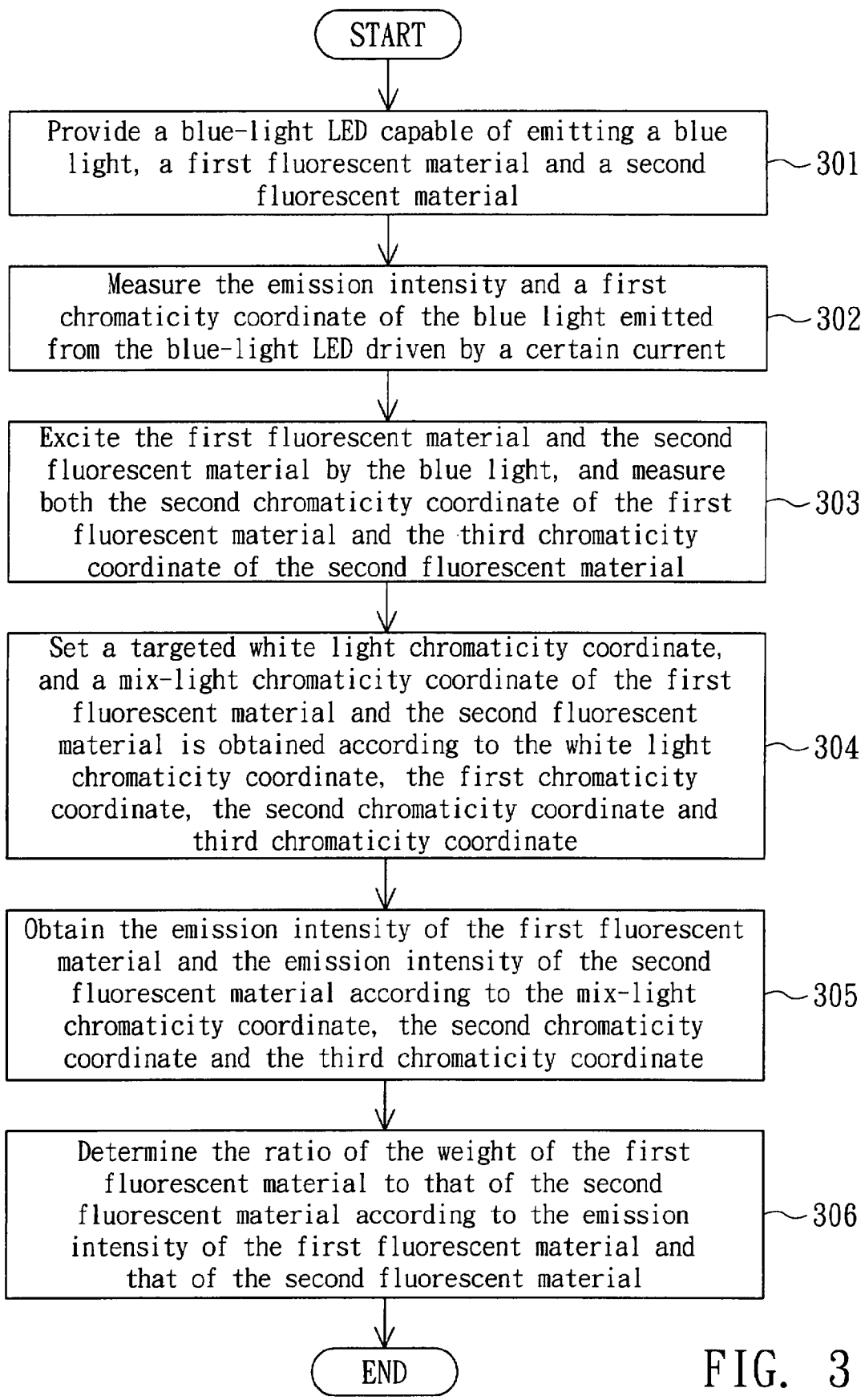
FIG. 3 is a flowchart of a manufacturing method of the light-emitting device of FIG. 1.

A method of manufacturing the light-emitting device 1 with open-loop design is elaborated below. Referring to FIG. 3, a flowchart of a manufacturing method of the light-emitting device of FIG. 1 is shown. The manufacturing method includes steps 301~306: Firstly, the LED 100 capable of emitting a blue light, the first fluorescent material 110 and the second fluorescent material 120 are provided. Next, the emission intensity of the blue light emitted from the LED 100 driven by a certain current and a first chromaticity coordinate are measured. Then, the first fluorescent material 110 and the second fluorescent material 120 are excited by a blue light with specific wavelength, and both the second chromaticity coordinate of the first fluorescent material 110 and third chromaticity coordinate of the second fluorescent material 120 are measured. Afterwards, a targeted white light chromaticity coordinate is set, and a mix-light chromaticity coordinate of the first fluorescent material 110 and the second fluorescent material 120 is obtained according to the white light chromaticity coordinate, the first chromaticity coordinate, the second chromaticity coordinate and third chromaticity coordinate. After that, the relational expression of the emission intensity of the first fluorescent material 110 vs. the emission intensity of the second fluorescent material 120 is obtained according to the mix-light chromaticity coordinate, the first chromaticity coordinate and the second chromaticity coordinate; and the ratio of the weight of the first fluorescent material 110 to that of the second fluorescent material 120 is determined according to the relational expression of the emission intensity of the first fluorescent material 110 vs. the concentration of the first fluorescent material 110 and the relational expression of the emission intensity of the second fluorescent material 120 vs. the concentration of the second fluorescent material 120.

The above method of manufacturing the light-emitting device 1 with open-loop design is disclosed in the following embodiments.

First Embodiment

In the embodiment, the first fluorescent material 110 is exemplified by a phosphor whose synthetic mixture is (Sr, Ba)$_2$SiO$_4$:Eu and chemical expression is (Sr$_{0.35}$Ba$_{1.6}$Eu$_{0.05}$)SiO$_4$. The first fluorescent material 110 can be synthesized by the use of solid-state reaction method. The second fluorescent material 120 is exemplified by a phosphor whose synthetic mixture is (Y$_3$Al$_5$O$_{12}$:Ce, Gd) and chemical expression is (Y$_{2.3}$Ce$_{0.05}$Gd$_{0.65}$) Al$_5$O$_{12}$. The second fluorescent material 120 can be synthesized by using solid-state reaction method or chemical synthesis method (such as citric acid gel method and co-precipitation synthesis method).

Figure 4:
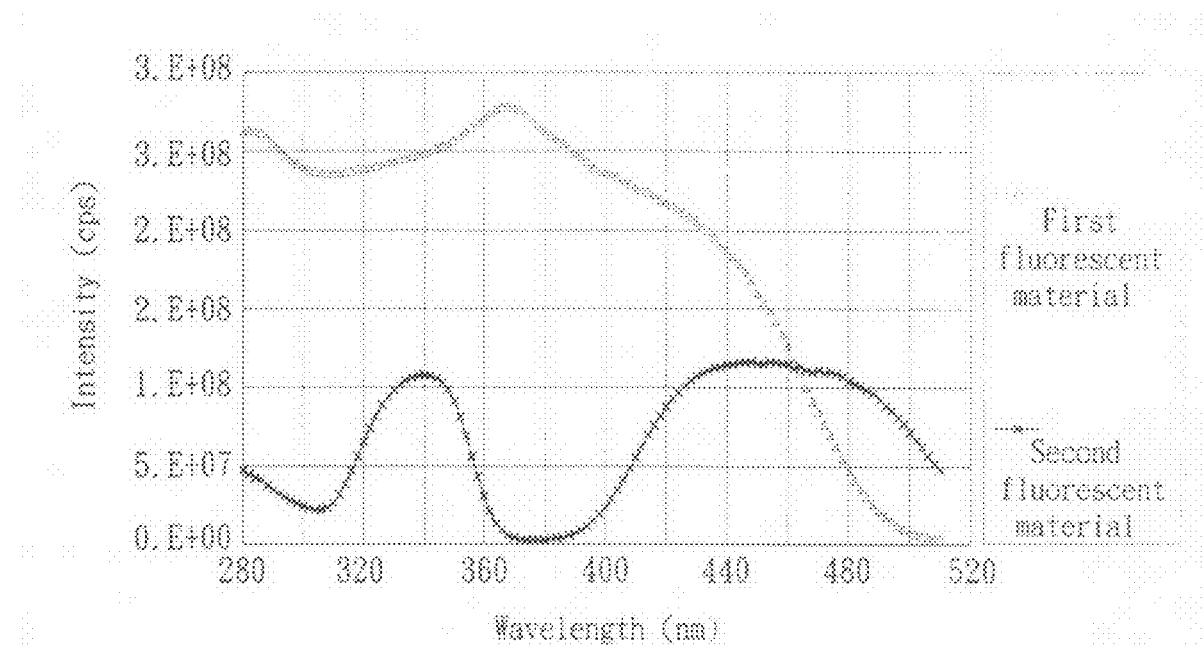
FIG. 4 is an excitation spectrum diagram of the first fluorescent material and the second fluorescent material of a first embodiment.

Referring to FIG. 4, an excitation spectrum diagram of the first fluorescent material and the second fluorescent material of the first embodiment is shown. The excitation spectrum of the first fluorescent material 110 is detected in the condition that an excitation light whose wavelength is 522 nm is used, and the excitation spectrum of the second fluorescent material 120 is detected in the condition that an excitation light whose wavelength is 548 nm is used. As indicated in FIG. 4, the curve lines of the excitation intensities of the first fluorescent material 110 and the second fluorescent material 120 intersect at a wavelength that is 462 nm. The excitation intensities of the first fluorescent material 110 and the second fluorescent material 120 are inversely proportional to the blue light wavelength with different deviations. That is, when the first fluorescent material 110 and the second fluorescent material 120 are excited by a short wavelength blue light smaller than 462 nm, the excitation intensity of the first fluorescent material 110 is higher than that of the second fluorescent material 120. On the contrary, when the first fluorescent material 110 and the second fluorescent material 120 are excited by a long wavelength blue light larger than 462 nm, the excitation intensity of the first fluorescent material 110 is lower than that of the second fluorescent material 120. The first fluorescent material 110 and the second fluorescent material 120 indeed satisfy the above-mentioned requirement that the dividing wavelength between the short wavelength blue light and the long wavelength blue light is within the range of 440~480 nm.

Figure 5A:
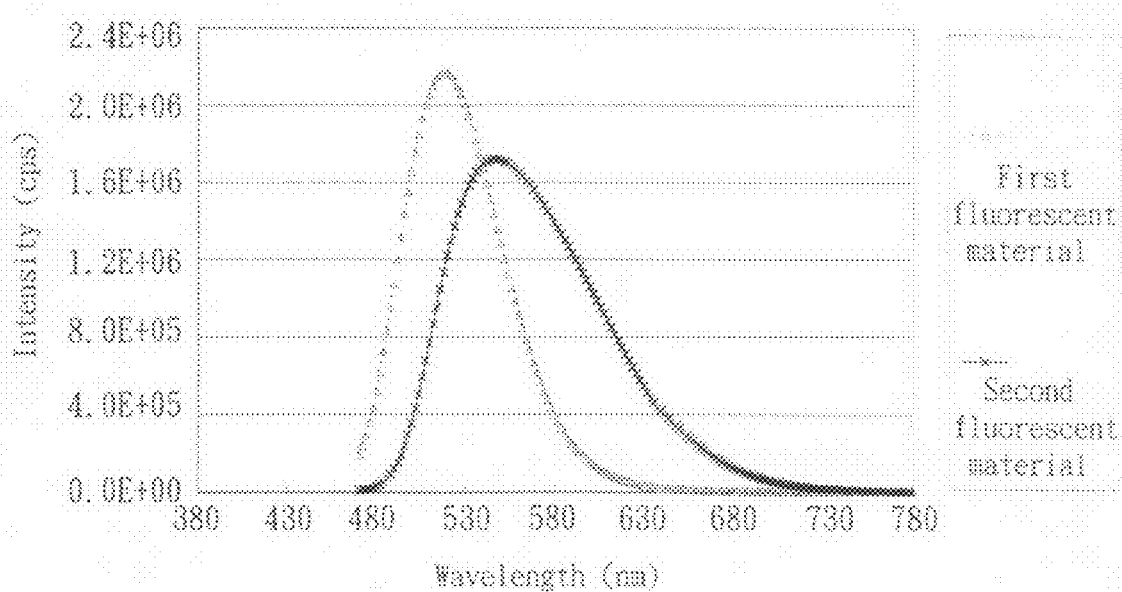
FIG. 5A is an emission spectrum diagram of the first fluorescent material and the second fluorescent material of the first embodiment measured by an excitation light whose wavelength is 455 nm.
Figure 5B:
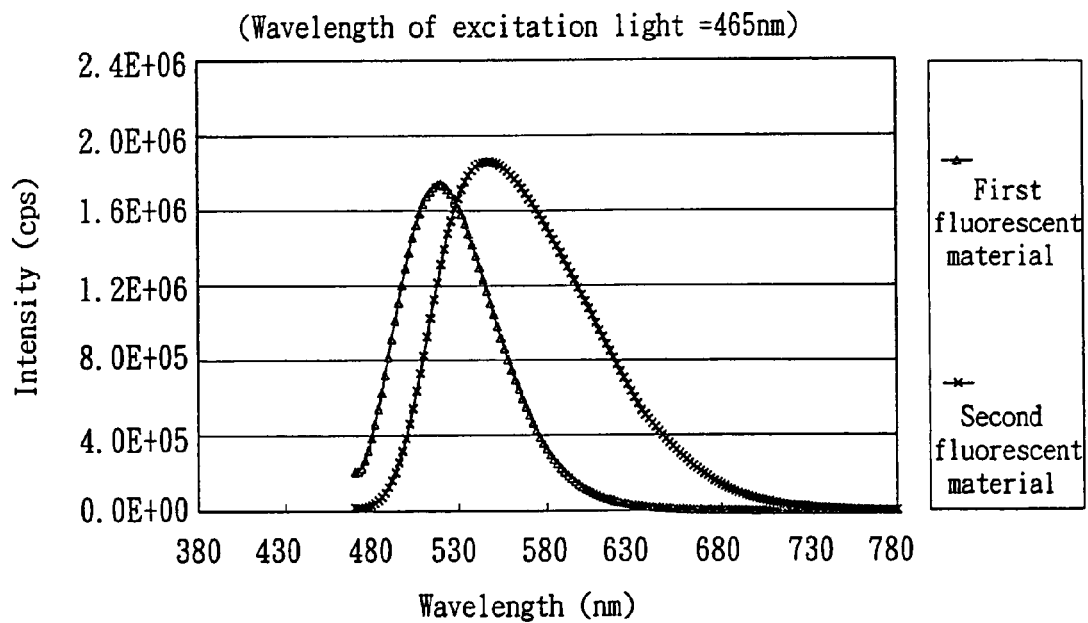
FIG. 5B is an emission spectrum diagram of the first fluorescent material and the second fluorescent material of the first embodiment measured by an excitation light whose wavelength is 465 nm.

Please refer to FIG. 5A~5B. FIG. 5A is an emission spectrum diagram of the first fluorescent material and the second fluorescent material of the first embodiment measured by an excitation light whose wavelength is 455 nm. FIG. 5B is an emission spectrum diagram of the first fluorescent material and the second fluorescent material of the first embodiment measured by an excitation light whose wavelength is 465 nm. The peak wavelength of the emission of the first fluorescent material 110 is 522 nm, which is smaller than that of the emission of the second fluorescent material 120 (548 nm).

As indicated in FIG. 5A, when a blue light whose wavelength is 455 nm is used as the excitation light, the proportion of the emission intensity of the first fluorescent material 110 to that of the second fluorescent material 120 is 1:0.8. As indicated in FIG. 5B, when a blue light whose wavelength is 465 nm is used as an excitation light, the proportion of the emission intensity of the first fluorescent material 110 to that of the second fluorescent material 120 is 1:1.1. According to the above experimental characteristics, the first fluorescent material 110 and the second fluorescent material 120 used in the first embodiment are indeed capable of automatically adjusting their respective emission intensities when the wavelength of the excitation light changes.

As indicated in FIG. 3, the method of manufacturing a light-emitting device begins at step 301, a blue-light LED 100, a first fluorescent material 110 and a second fluorescent material 120 are provided. A light-emitting layer of the LED 100 can be made from a nitride semiconductor. The dominant wavelength of the emission light of the light-emitting layer is preferably within the range of 430 nm~490 nm. Within the above wavelength range, the first fluorescent material 110 and the second fluorescent material 120 both have the above-mentioned characteristics of being inversely proportional to the blue light wavelength with different deviations. In the first embodiment, the LED 100 can be made from indium gallium nitride (InGaN) that can emit a light whose dominant wavelength is 460 nm. After the materials for the first fluorescent material 110 and the second fluorescent material 120 are selected, and the mixture proportion between the first fluorescent material 110 and the second fluorescent material 120 is determined accordingly, then the LED 100, the first fluorescent material 110 and the second fluorescent material 120 are packaged together to form a LED capable of emitting a white light (white-light LED).

In the step 302, the emission intensity of the LED 100 driven by a certain current and the first chromaticity coordinate of the LED 100 are measured. A 20-microampere (mA) current is applied to the LED 100 made from indium gallium nitride. The first chromaticity coordinate is then measured and marked as C1 in FIG. 6 that is a chromaticity coordinate diagram stipulated by the Commission International de l'Eclairage (CIE) in 1931.

Then, the process proceeds to step 303, the first fluorescent material 110 and the second fluorescent material 120 are excited by a blue light whose wavelength is 460 nm, and the second chromaticity coordinate of the first fluorescent material 110 and the third chromaticity coordinate of the second fluorescent material 120 are both measured. The position of the second chromaticity coordinate is marked as P1 in FIG. 6, and the position of the third chromaticity coordinate is marked as P2 in FIG. 6.

Figure 6:
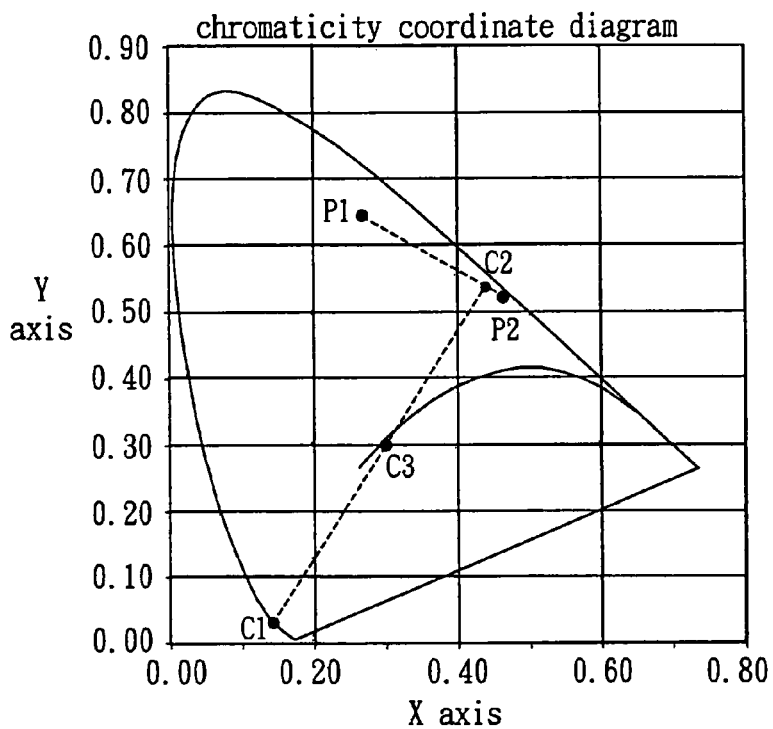
FIG. 6 and FIG. 10 are 1931 CIE chromaticity coordinate diagrams.

Afterwards, the process proceeds to the step 304 describes, a white light chromaticity coordinate is set, and the mix-light chromaticity coordinate of the first fluorescent material 110 and the second fluorescent material 120 is obtained according to the white light chromaticity coordinate and the first to the third chromaticity coordinates. A predetermined chromaticity coordinate can be designated as the white light chromaticity coordinate. In the embodiment, coordinate (0.300, 0.310) is designated as the white light chromaticity coordinate for example, which is marked as C3 in FIG. 6. The first to the third chromaticity coordinates are measured and obtained, and are respectively marked as C1, P1, P2. The white light chromaticity coordinate (C3) is also already known. In FIG. 6, the position of the intersection C2 of the extension line of line C1-C3 and the line P1-P2 is exactly the position of the mix-light chromaticity coordinate of the first fluorescent material 110 and the second fluorescent material 120. Thus, the actual coordinate of the mix-light chromaticity coordinate (C2) can be obtained by resolving the simultaneous equations of the two lines C1-C3 and P1-P2.

After that, as the step 305 illustrates, the intensity of the emission of the first fluorescent material 110 and that of the second fluorescent material 120 are obtained according to the mix-light chromaticity coordinate (C2), the second chromaticity coordinate (P1) and the third chromaticity coordinate (P2). The intensities of the emissions of the first fluorescent material 110 and the second fluorescent material 120 can be derived from a mix-color formula expressed as:

$$x = \frac{\frac{m1x1}{y1} + \frac{m2x2}{y2}}{\frac{m1}{y1} + \frac{m2}{y2}} \quad (1)$$

$$y = \frac{\frac{m1y1}{y1} + \frac{m2y2}{y2}}{\frac{m1}{y1} + \frac{m2}{y2}} \quad (2)$$

Wherein, (x, y) is the mix-light chromaticity coordinate of a color light (x1, y1) and a colored light (x2, y2), m1 is the intensity of the color light (x1, y1), and m2 is the intensity of the color light (x2, y2). In the step, the mix-light chromaticity coordinate (C2) is (x, y), the second chromaticity coordinate (P1) of the first fluorescent material 110 is (x1, y1), the third chromaticity coordinate (P2) of the second fluorescent material 120 is (x2, y2), m1 is the emission intensity of the first fluorescent material 110, and m2 is the emission intensity of the second fluorescent material 120. By substitutions of the coordinates (x, y), (x1, y1) and (x2, y2) which are already known to the above formula (1)~(2), the simultaneous equations are resolved and the emission intensity m1 of the first fluorescent material 110 and the emission intensity m2 of the second fluorescent material 120 are obtained.

Then, the process proceeds to the step 306, the ratio of the weight of the first fluorescent material 110 to that of the second fluorescent material 120 is determined according to the emission intensity m1 of the first fluorescent material 110 and the emission intensity m2 of the second fluorescent material 120. The emission intensity of a fluorescent material is related to the concentration of the fluorescent material. Particularly, the relation curve of emission intensity vs. weight ratio for each fluorescent material can be obtained from the experiment of the fluorescent material. Therefore, after the emission intensity m1 of the first fluorescent material 110 and the emission intensity m2 of the second fluorescent material 120 are respectively obtained, the weight ratio of the first fluorescent material 110 to the second fluorescent material 120 can be obtained from their corresponding relation in the relation curve. The weight ratio of the first fluorescent material 110 to the second fluorescent material 120 is then determined. The step of packaging the LED 100, the first fluorescent material 110 and the second fluorescent material 120 can be performed accordingly.

When the blue light whose wavelength is 455 nm is used as the excitation light, the ratio m1:m2 of the emission intensity of the first fluorescent material to that of the second fluorescent material is approximately 1:0.8. When the blue light whose wavelength is 465 nm is used as the excitation light, the ratio m1:m2 of the emission intensity of the first fluorescent material to that of the second fluorescent material is approximately 1:1.1. In the above two different conditions, the weight ratios of the first fluorescent material 110 to the second fluorescent material 120 are derived accordingly. The mixtures of the first fluorescent material 110 and the second fluorescent material 120 are formed according to the weight ratios. Then, the fluorescent mixtures are further mixed with a specific gel (for example, the ratio for silicon gel to fluorescent material is 1:0.2), and respectively packed with a 455 nm wavelength blue-light LED 100 and a 465 nm wavelength blue-light LED 100 to form two white light LEDs. Then the two white light LEDs are tested together.

Figure 7:
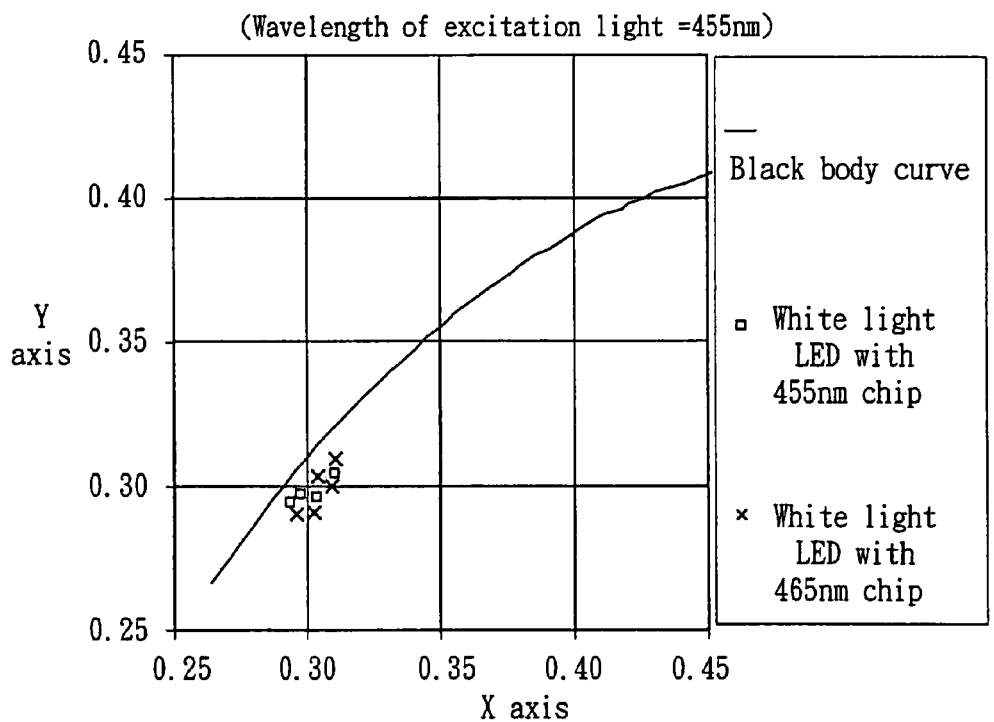
FIG. 7 is a chromaticity coordinate diagram of sample test according to the first embodiment where the light emitting diodes emitting 455 nanometer wavelength blue light and 465 nanometer wavelength blue light respectively are incorporated with two specific fluorescent materials.

Referring to FIG. 7, a chromaticity coordinate diagram of sample test according to the first embodiment where the LEDs emitting 455 nm wavelength blue light and 465 nm wavelength blue light respectively are incorporated with two specific fluorescent materials is shown. As shown in FIG. 7, the chromaticity coordinates of the two samples of white light LED are both around the predetermined white light chromaticity coordinate (0.300, 0.310).

Second Embodiment

The first fluorescent material used in this embodiment is the same as that used in the first embodiment, that is, a phosphor whose chemical expression is $(Sr_{0.35}Ba_{1.6}Eu_{0.05})SiO_4$. However, the second fluorescent material used in this embodiment is a phosphor whose synthetic mixture is CaS:Eu and chemical expression is $(Ca_{0.99}Eu_{0.01})S$. The second fluorescent material can be synthesized by the use of solid-state reaction method.

Figure 8:
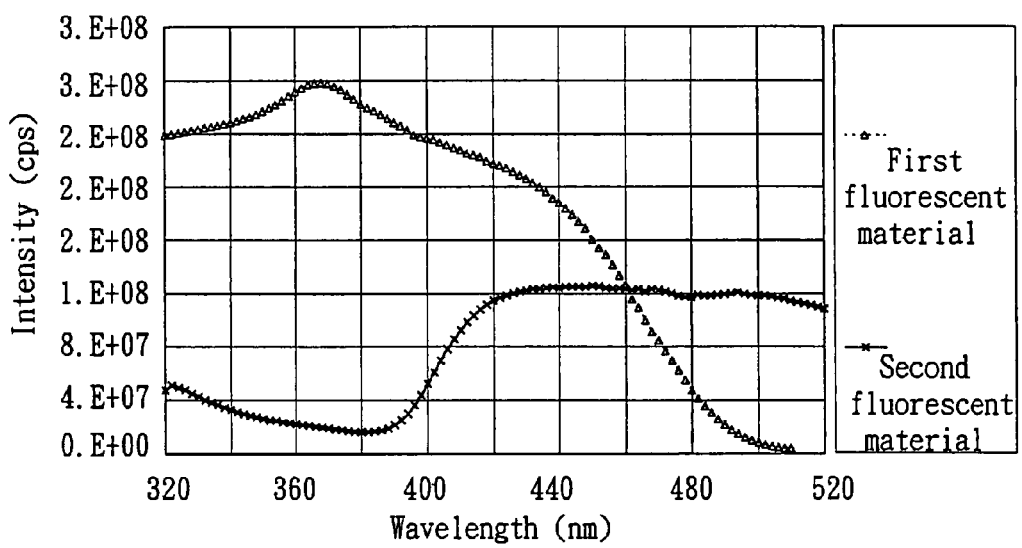
FIG. 8 is an excitation spectrum diagram of the first fluorescent material and the second fluorescent material of a second embodiment.

Referring to FIG. 8, an excitation spectrum diagram of the first fluorescent material and the second fluorescent material of the second embodiment is shown. The excitation spectrum of the first fluorescent material 110 is detected in the condition that an excitation light whose wavelength is 522 nm is used, and the excitation spectrum of the second fluorescent material 120 is detected in the condition that an excitation light whose wavelength is 626 nm. As indicated in FIG. 8, the curve lines of the excitation intensities of the first fluorescent material 110 and the second fluorescent material 120 intersect at a wavelength that is 460 nm. The excitation intensities of the first fluorescent material 110 and the second fluorescent material 120 are inversely proportional to the blue light wavelength with different deviations. That is, when the first fluorescent material 110 and the second fluorescent material 120 are excited by a short wavelength blue light smaller than 460 nm, the excitation intensity of the first fluorescent material 110 is higher than that of the second fluorescent material 120. On the contrary, when the first fluorescent material 110 and the second fluorescent material 120 are excited by a long wavelength blue light larger than 460 nm, the excitation intensity of the first fluorescent material 110 is lower than that of the second fluorescent material 120, the excitation intensity of the first fluorescent material 110 is lower than that of the second fluorescent material 120.

Figure 9A:
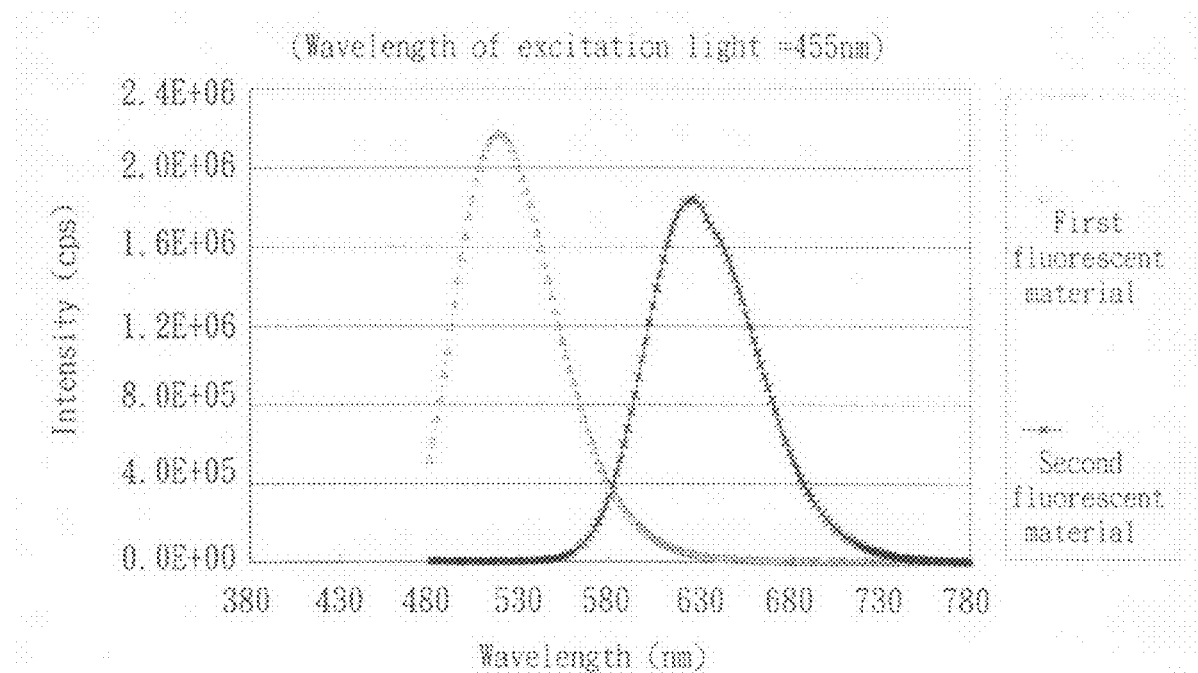
FIG. 9A is an emission spectrum diagram of the first fluorescent material and the second fluorescent material of the second embodiment measured by an excitation light whose wavelength is 455 nm.
Figure 9B:
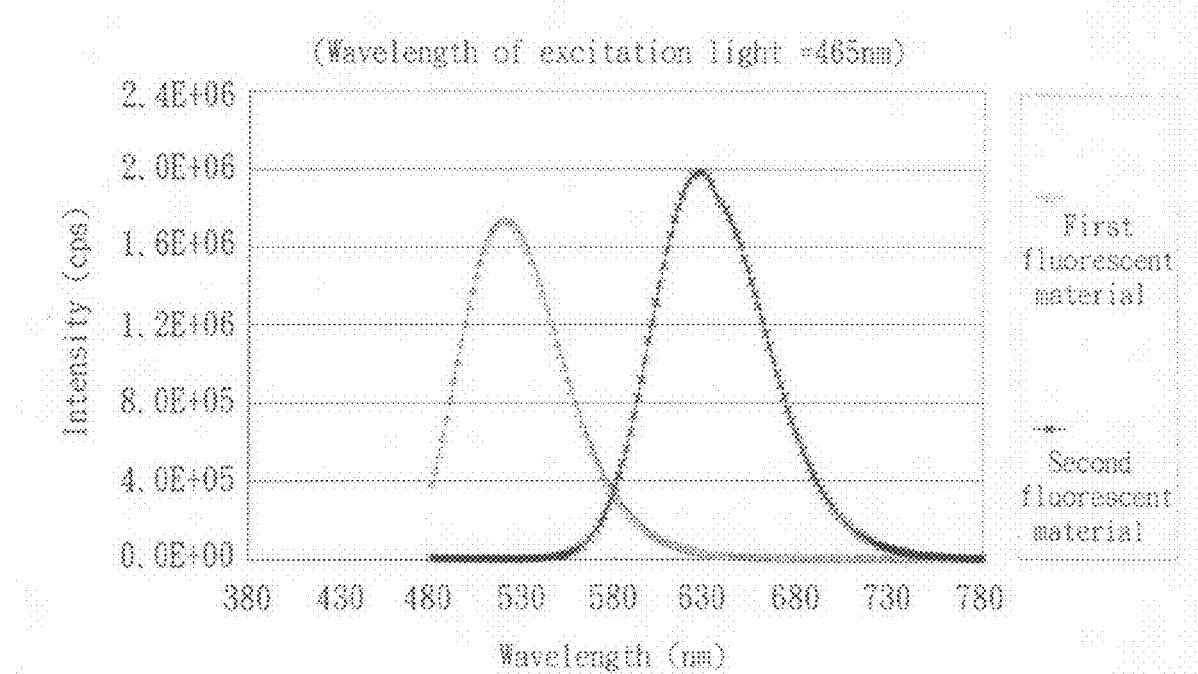
FIG. 9B is an emission spectrum diagram of the first fluorescent material and the second fluorescent material of the second embodiment measured by an excitation light whose wavelength is 465 nm.

Please refer to FIG. 9A~9B. FIG. 9A is an emission spectrum diagram of the first fluorescent material and the second fluorescent material of the second embodiment measured by an excitation light whose wavelength is 455 nm. FIG. 9B is an emission spectrum diagram of the first fluorescent material and the second fluorescent material of the second embodiment measured by an excitation light whose wavelength is 465 nm. The peak wavelength of the emission of the first fluorescent material 110 is 522 nm, which is smaller than that of the emission of the second fluorescent material 120 (626 nm).

As indicated in FIG. 9A, when a wavelength 455 nm blue light is used as the excitation light, the proportion of the emission intensity of the first fluorescent material 110 to that of the second fluorescent material 120 is 1:0.85. As indicated in FIG. 9B, when a 465 nm wavelength blue light as the excitation light, the proportion of the emission intensity of the first fluorescent material 110 to that of the second fluorescent material 120 is 1:1.15. According to the above experimental characteristics, the first fluorescent material 110 and the second fluorescent material 120 used in this embodiment are indeed capable of automatically adjusting their respective emission intensities when the wavelength of the excitation light changes In the second embodiment, the LED 100 can be made from indium gallium nitride (InGaN). The dominant wavelength of the light emitted from indium gallium nitride (InGaN) is preferably about 460 nm.

Figure 10:
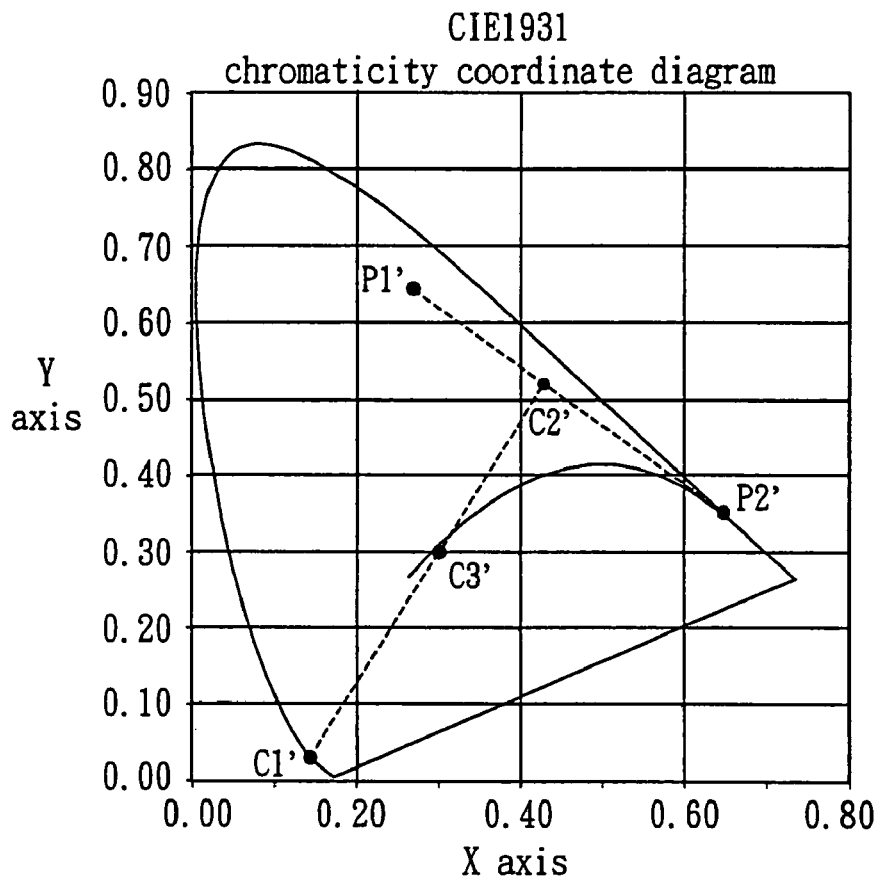

The steps of the second embodiment are the same as that in the first embodiment. The position of the first chromaticity coordinate of the LED 100, the position of the second chromaticity coordinate of the first fluorescent material 110, and the position of the third chromaticity coordinate of the second fluorescent material 120 are respectively marked as C', P1' and P2' in the chromaticity coordinate diagram of FIG. 10. The mix-light chromaticity coordinate (marked as C2') of the first fluorescent material 110 and the second fluorescent material 120 is obtained according to the white light chromaticity coordinate C3', and the first to the third chromaticity coordinates (marked as C1', P1', P2'). By substitutions of the coordinates of the mix-light chromaticity coordinate (C2'), the second chromaticity coordinate (P1') and third chromaticity coordinate (P2') to the mix-color formula (1)~(2), the emission intensity m1' of the first fluorescent material 110 and the emission intensity m2' of the second fluorescent material 120 are obtained.

When a wavelength 455 nm blue light is used as the excitation light, the ratio m1':m2' of the emission intensity of the first fluorescent material to that of the second fluorescent material is approximately 1:0.85. When a wavelength 465 nm blue light is used as the excitation light, the ratio m1':m2' of the emission intensity of the first fluorescent material to that of the second fluorescent material is approximately 1:1.15. In the above two different conditions, the weight ratios of the first fluorescent material 110 to the second fluorescent material 120 are also derived accordingly. The mixtures of the first fluorescent material 110 and the second fluorescent material 120 are formed according to the weight ratios. Then, the fluorescent mixtures are further mixed with a specific gel (for example, the ratio for silicon gel to fluorescent material is 1:0.15), and respectively packed with a 455 nm wavelength blue-light LED 100 and a 465 nm wavelength blue-light LED 100 to form two white light LEDs. The two white light LEDs are then tested together.

Figure 11:
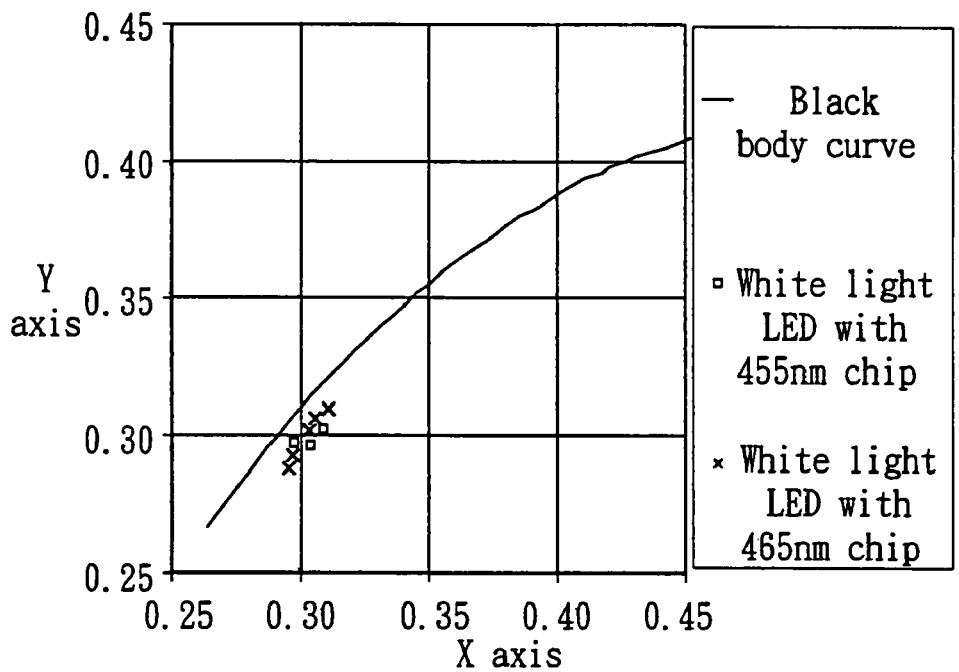
FIG. 11 is a chromaticity coordinate diagram of sample test according to the second embodiment where the light emitting diodes emitting 455 nanometer wavelength blue light and 465 nanometer wavelength blue light respectively are incorporated with two specific fluorescent materials.

Referring to FIG. 11, a chromaticity coordinate diagram of sample test according to the second embodiment where the LEDs emitting 455 nm wavelength blue light and 465 nm wavelength blue light respectively are incorporated with two specific fluorescent materials is shown. In FIG. 11, the chromaticity coordinates of the two samples of white light LED are both around the predetermined white light chromaticity coordinate (0.300, 0.310).

Despite the first fluorescent material 110 and the second fluorescent material 120 used in the first and the second embodiments are selected from phosphors whose chemical expressions are $(Sr_{0.35}Ba_{1.6}Eu_{0.05})SiO_4$, $(Y_{2.3}Ce_{0.05}Gd_{0.65})Al_5O_{12}$ and $(Ca_{0.99}Eu_{0.01})S$, however, the invention is not limited thereto. In actual application, the first fluorescent material 110 can be selected from a phosphors whose chemical expression is $(Ba_xSr_yCa_z)_2SiO_4$:Eu, wherein x+y+=1; or $(Ba_xSr_yCa_z)_3SiO_5$:Eu, wherein x+y+z=1; or $(Ba_xSr_yCa_z)_3SiO_5$:Ce, Li, wherein x+y+z=1; or $(M_xGa_2S_4)$:Eu, wherein $1 \leq x < 1.2$, and M is selected from a group consisting of metal elements such as calcium (Ca), strontium (Sr), barium (Ba) and magnesium (Mg) or the above-mentioned metal elements; or $M_{1-x}Si_2N_{2-y}O_{2-z}$:A, wherein $0<x\leq1$, $0\leq y\leq1$, $0\leq z\leq1$, M is selected from a group consisting of metal elements such as calcium (Ca), strontium (Sr), barium (Ba) and magnesium (Mg) or the above-mentioned metal elements, and A is selected from a group consisting of metal elements such as europium (Eu), cerium (Ce), manganese (Mn) and dysprosium (Dy) or the above-mentioned metal elements; or $Ca_3M_2Si_3O_{12}$:Ce, M is selected from a group consisting of metal elements such as strontium (Sr), scandium (Sc), magnesium (Mg) and barium (Ba) or the above-mentioned metal elements; or $CaSc_2O_4$:Ce; or $Ca_{8-x}(Mg, Mn)(SiO_4)_4Cl_2$:Eu, wherein $0<x\leq1$; or $M_xSi_{12-y-z}Al_{y+z}$:Ce, wherein $0<x\leq1$, $0\leq y\leq1$, $0\leq z\leq1$, M is selected from a group consisting of metal elements such as calcium (Ca), strontium (Sr), barium (Ba), magnesium (Mg), lithium (Li) and yttrium (Y) or the above-mentioned metal elements; or $M_xSi_{12-y-z}Al_{y+z}O_zN_{16-z}$:Yb, wherein $0<x\leq1$, $0\leq y\leq1$, $0\leq z\leq1$, M is selected from a group consisting of metal elements such as calcium (Ca), strontium (Sr), barium (Ba), magnesium (Mg), lithium (Li) and yttrium (Y) or the above-mentioned metal elements; or $M_xSi_{6-z}Al_zO_zN_{8-z}$:Eu, wherein $0<z\leq4.2$, M is selected from a group consisting of metal elements such as calcium (Ca), strontium (Sr), barium (Ba) and magnesium (Mg) or the above-mentioned metal elements.

As for the second fluorescent material 120, it can be selected from a garnet phosphors activated by cerium (Ce) and composed of at least one element of yttrium (Y), terbium (Tb), lanthanum (La), gadolinium (Gd) and samarium (Sm) and at least one element of aluminum (Al), gallium (Ga), indium (In) and iron (Fe), or $M_xS$:Eu phosphor, wherein $1\leq x<1.2$, and M is selected from a group consisting of metal elements such as calcium (Ca), strontium (Sr) and barium (Ba) or the above-mentioned metal elements; or $Ca_xAl_ySi_zN_3$:Ce phosphor, wherein $0<x\leq1$, $0<y\leq1$; or $(Ca_xAl_{1-x})Si_yN_{2-z}O_z$:Ce phosphor, wherein $0<x\leq1$, $0<z\leq1$; or $M_{1-x}Si_2N_{2-y}O_{2-z}$:Yb phosphor, wherein $0<x\leq1$, $0\leq y\leq1$, $0\leq z\leq1$, and M is selected from a group consisting of metal elements such as calcium (Ca), strontium (Sr) and barium (Ba) or the above-mentioned metal elements; or $M_{2-x}Si_5N_{8-y}$:N phosphor, wherein $0<x\leq1$, $0\leq y\leq1$, M is selected from a group consisting of metal elements such as calcium (Ca), strontium (Sr) and barium (Ba) or the above-mentioned metal elements, and N is selected from a group consisting of metal elements such as europium (Eu), cerium (Ce), manganese (Mn) and dysprosium (Dy) or the above-mentioned metal elements; or $A_{2-x}(MF_6)$:Mn phosphor, wherein $0<x\leq1$, A is selected from a group consisting of metal elements such as potassium (K), rubidium (Rb) and cesium (Cs) or the above-mentioned metal elements, and M is selected from a group consisting of metal elements such as silicon (Si), germanium (Ge) and titanium (Ti) or the above-mentioned metal elements; or $MAlSiN_3$:Eu phosphor, M is selected from a group consisting of metal elements such as calcium (Ca), strontium (Sr) and barium (Ba) or the above-mentioned metal elements; or $M_xSi_{12-y-z}Al_{y+z}O_zN_{16-z}$:Eu phosphor, wherein $0<x\leq1$, $0\leq y\leq1$, $0\leq z\leq1$, M is selected from a group consisting of metal elements such as calcium (Ca), strontium (Sr), barium (Ba), magnesium (Mg), lithium (Li) and yttrium (Y) or the above-mentioned metal elements.

The first and the second embodiments are merely two embodiments of the invention, and the scope of technology of the invention is not limited thereto. Any designs using open-loop control theory to form a white light LED by using an LED capable of emitting a blue light and two fluorescent materials capable of being excited by the blue light as system inputs are within the scope of technology of the invention. Besides, of the two fluorescent materials, the peak wavelength of the emission of the first fluorescent material is smaller than that of the emission of the second fluorescent material. When a short wavelength blue light is used to excite the two fluorescent materials, the excitation intensity of the first fluorescent material is higher than that of the second fluorescent material. On the contrary, when a long wavelength blue light is used to excite the two fluorescent materials, the excitation intensity of the first fluorescent material is lower than that of the second fluorescent material. According to the above characteristics, when the wavelength of the blue light emitted from the LED changes, the mix-light chromaticity coordinate of the first fluorescent material and the second fluorescent material will adjust automatically, such that although the wavelength of the blue-light LED is not stable, the chromaticity coordinate of the white light synthesized by mixing the blue light emitted by the LED with the mix-light of the first fluorescent material and the second fluorescent material always remains at a fixed chromaticity coordinate, thereby forming a mixed white light of a white light LED as a system output and controlling the white light chromaticity coordinate at a fixed level. Such design is still within the scope of protection of the invention.

Compared with the five conventional methods of manufacturing a white light LED and the method of controlling the mix-light chromaticity coordinate, the light-emitting device with open-loop design of the invention effectively compensates the mix-light spectrum and automatically controls the white light chromaticity coordinate at a fixed chromaticity coordinate to have the effect of a white light LED. By the use of fluorescent materials, there is no need to use any additional control circuits. Thus, the invention has great value in commercial uses.

According to the light-emitting device and manufacturing method thereof disclosed in the above embodiments of the invention, two fluorescent materials having a specific weight ratio are combined with a blue-light LED. When the fluorescent materials are excited by a blue light emitted by the blue-light LED, the mix-light chromaticity coordinate of the two fluorescent materials will adjust automatically when the wavelength of the blue light changes. Thus, the white light chromaticity coordinate synthesized by mixing the blue-light LED with the two fluorescent materials will always remain at a fixed, predetermined coordinate, making the property of the mixed white light better.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light-emitting device with open-loop control, comprising: a light emitting diode (LED) capable of emitting a blue light; and a mix-light adjust portion comprising a first fluorescent material and a second fluorescent material that are capable of being excited by the blue light, wherein the first fluorescent material and the second fluorescent material satisfy at least one of the following conditions (1) and (2):

(1) the first fluorescent material is $(Ba_xSr_yCa_z)_2SiO_4$:Eu phosphor, wherein x+y+z=1; or $(Ba_xSr_yCa_z)_3SiO_5$:Eu, wherein x+y+z=1; or $(Ba_xSr_yCa_z)_3SiO_5$:Ce, Li phosphor, wherein x+y+z=1; or $M_xGa_2S_4$:Eu phosphor wherein $1 \leq x < 1.2$ and M s selected from a group consisting of calcium (Ca), strontium (Sr), barium (Ba), and magnesium (Mg) or the above-mentioned metal elements; or $M_{1-x}Si_2N_{2-y}O_{2-z}$:A phosphor, wherein $0 < x \leq 1$, $0 \leq y \leq 1$, $0 \leq z \leq 1$, M is selected from a group consisting of calcium (Ca), strontium (Sr), barium (Ba), and magnesium (Mg) or the above-mentioned metal elements, and A is selected from a group consisting of europium (Eu), cerium (Ce), manganese (Mn), and dysprosium (Dy), or the above-mentioned metal elements; or $Ca_3M_2Si_3O_{12}$:Ce phosphor, M is selected from a group consisting strontium (Sr), scandium (Sc), magnesium (Mg), and barium (Ba) or the above-mentioned metal elements; or $CaSc_2O_4$:Ce phosphor; or $Ca_{8-x}(Mg, Mn)(SiO_4)_4Cl_2$:Eu phosphor, wherein $0 < x \leq 1$, $0 \leq y \leq 1$, $0 \leq z \leq 1$, M is selected from a group consisting of calcium (Ca), strontium (Sr), barium (Ba), magnesium (Mg), lithium (Li), and yttrium (Y) or the above mentioned metal elements; or $M_xSi_{12-y-z}Al_{y+z}O_zN_{16-z}$:Yb phosphor, wherein $0 < x \leq 1$, $0 \leq y \leq 1$, $0 \leq z \leq 1$, M is selected from a group consisting of calcium (Ca), strontium (Sr), barium (Ba), magnesium (Mg), lithium (Li), yttrium (Y) or the above-mentioned metal elements; or $M_xSi_{6-z}Al_zO_zN_{8-z}$:Eu phosphor wherein $0 < z \leq 4.2$, M is selected from a group consisting of calcium (Ca), strontium (Sr), barium (Ba), and magnesium (Mg) or the above-mentioned metal elements; and (2) the second fluorescent material is a garnet phosphor activated by cerium (Ce) and composed of at least one element of yttrium (Y), terbium (Tb), lanthanum (La), gadolinium (Gd), and samarium (Sm) and at least one element of aluminum (Al), gallium (Ga), indium (In) and iron (Fe); or $M_xS$:Eu phosphor, wherein $1 \leq x < 1.2$ and M is selected from a group consisting of calcium (Ca), strontium (Sr), and barium (Ba) or the above-mentioned metal elements; or $Ca_xAl_ySi_zN_3$:Ce phosphor, wherein $0 < x \leq 1$, $0 < y \leq 1$, $0 < z \leq 1$; or $(Ca_xAl_{1-x})Si_yN_{2-z}O_z$:Ce phosphor, wherein $0 < x \leq 1$, $0 < y \leq 1$, $0 < z \leq 1$; or $M_{1-x}Si_2N_{2-y}O_{2-z}$:Yb phosphor, wherein $0 < x \leq 1$, $0 \leq y \leq 1$, $0 \leq z \leq 1$, and M is selected from a group consisting of calcium (Ca), strontium (Sr) and barium (Ba) or the above-mentioned metal elements; or $M_{2-x}Si_5N_{8-y}$:N phosphor, wherein $0 < x \leq 1$, $0 \leq y \leq 1$, M is selected from a group consisting of calcium (Ca), strontium (Sr) and barium (Ba) or the above-mentioned metal elements, and N is selected from a group consisting of europium (Eu), cerium (Ce), manganese (Mn) and dysprosium (Dy) or the above-mentioned metal elements; or $A_{2-x}(MF_6)$:Mn phosphor, wherein $0 < x \leq 1$, A is selected from a group consisting of potassium (K), rubidium (Rb) and cesium (Cs) or the above-mentioned metal elements, and M is selected from a group consisting of silicon (Si), germanium (Ge) and titanium (Ti) or the above-mentioned metal elements; or $MAlSiN_3$:Eu phosphor, M is selected from a group consisting of calcium (Ca), strontium (Sr) and barium (Ba) or the above-mentioned metal elements; or $M_xSi_{12-y-z}Al_{y+z}O_zN_{16-z}$:Eu phosphor, wherein $0 < x \leq 1$, $0 \leq y \leq 1$, $0 \leq z \leq 1$, M is selected from a group consisting of calcium (Ca), strontium (Sr), barium (Ba), magnesium (Mg), lithium (Li) and yttrium (Y) or the above-mentioned metal elements; or $(Ba_xSr_yCa_z)_2SiO_4$:Eu phosphor, $(Ba_xSr_yCa_z)_3SiO5$:Eu phosphor, or $(Ba_xSr_yCa_z)_3SiO_5$:Ce, Li phosphor, x+y+z=1; wherein, when the first fluorescent material and the second fluorescent material are excited by a short-wavelength blue light, the excitation intensity of the first fluorescent material is higher than the excitation intensity of the second fluorescent material, when the first fluorescent material and the second fluorescent material are excited by a long-wavelength blue light, the excitation intensity of the first fluorescent material is lower than the excitation intensity of the second fluorescent material, the peak wavelength of the emission of the first fluorescent material is smaller than the peak wavelength of the emission of the second fluorescent material, the dividing wavelength between the short-wavelength blue light and the long-wavelength blue light ranges from a first wavelength to a second wavelength.

2. The light-emitting device according to claim 1, wherein the first wavelength is approximately 440 nm, and the second wavelength is approximately 480 nm.

3. The light-emitting device according to claim 1, wherein the ratio of the weight of the first fluorescent material to the weight of the second fluorescent material is relevant to the emission intensity of the first fluorescent material and the emission intensity of the second fluorescent material.

4. The light-emitting device according to claim 1, wherein when the LED is a nitride compound semiconductor, the dominant wavelength of the blue light ranges from 430 to 490 nm.

5. A method of manufacturing a light-emitting device, the method comprising: providing a LED capable of emitting a blue light, a first fluorescent material and a second fluorescent material, wherein the first fluorescent material and the second fluorescent material satisfy at least one of the following conditions (1) and (2):

(1) the first fluorescent material is $(Ba_xSr_yCa_z)_2SiO_4$:Eu phosphor, wherein $x+y+z=1$; or $(Ba_xSr_yCa_z)_3SiO_5$:Eu, wherein $x+y+z=1$; or $(Ba_xSr_yCa_z)_3SiO_5$:Ce, Li phosphor, wherein $x+y+z=1$; or $M_xGa_2S_4$:Eu phosphor wherein $1 \leq x < 1.2$ and M is selected from a group consisting of calcium (Ca), strontium (Sr), barium (Ba), and magnesium (Mg) or the above-mentioned metal elements; or $M_{1-x}Si_2N_{2-y}O_{2-z}$:A phosphor, wherein $0 < x \leq 1$, $0 \leq y \leq 1$, $0 \leq z \leq 1$, M is selected from a group consisting of calcium (Ca), strontium (Sr), barium (Ba), and magnesium (Mg) or the above-mentioned metal elements, and A is selected from a group consisting of europium (Eu), cerium (Ce), manganese (Mn), and dysprosium (Dy), or the above-mentioned metal elements; or $Ca_3M_2Si_3O_{12}$:Ce phosphor, M is selected from a group consisting strontium (Sr), scandium (Sc), magnesium (Mg), and barium (Ba) or the above-mentioned metal elements; or $CaSc_2O_4$:Ce phosphor; or $Ca_{8-x}(Mg,Mn)(SiO_4)_4Cl_2$:Eu phosphor, wherein $0 < x \leq 1$, $0 \leq y \leq 1$, $0 \leq z \leq 1$, M is selected from a group consisting of calcium (Ca), strontium (Sr), barium (Ba), magnesium (Mg), lithium (Li), and yttrium (Y) or the above mentioned metal elements; or $M_xSi_{12-y-z}Al_{y+z}O_2N_{16-z}$:Yb phosphor, wherein $0 < x \leq 1$, $0 \leq y \leq 1$, $0 \leq z \leq 1$, M is selected from a group consisting of calcium (Ca), strontium (Sr), barium (Ba), magnesium (Mg), lithium (Li), yttrium (Y) or the above-mentioned metal elements; or $M_xSi_{6-z}Al_zO_zN_{8-z}$:Eu phosphor wherein $0 < z \leq 4.2$, M is selected from a group consisting of calcium (Ca), strontium (Sr), barium (Ba), and magnesium (Mg) or the above-mentioned metal elements; and (2) the second fluorescent material is a garnet phosphor activated by cerium (Ce) and composed of at least one element of yttrium (Y), terbium (Tb), lanthanum (La), gadolinium (Gd), and samarium (Sm) and at least one element of aluminum (Al), gallium (Ga), indium (In) and iron (Fe); or $M_xS$:Eu phosphor, wherein $1 \leq x < 1.2$ and M is selected from a group consisting of calcium (Ca), strontium (Sr), and barium (Ba) or the above-mentioned metal elements; or $Ca_xAl_ySi_zN_3$:Ce phosphor, wherein $0 < x \leq 1$, $0 < y \leq 1$, $0 < z \leq 1$; or $(Ca_xAl_{1-x})Si_yN_{2-z}O_z$:Ce phosphor, wherein $0 < x \leq 1$, $0 < y \leq 1$, $0 < z \leq 1$; or $M_{1-x}Si_2N_{2-y}O_{2-z}$:Yb phosphor, wherein $0 < x \leq 1$, $0 \leq y \leq 1$, $0 \leq z \leq 1$, and M is selected from a group consisting of calcium (Ca), strontium (Sr) and barium (Ba) or the above-mentioned metal elements; or $M_{2-x}Si_5N_{8-y}$:N phosphor, wherein $0 < x \leq 1$, $0 \leq y \leq 1$, M is selected from a group consisting of calcium (Ca), strontium (Sr) and barium (Ba) or the above-mentioned metal elements, and N is selected from a group consisting of europium (Eu), cerium (Ce), manganese (Mn) and dysprosium (Dy) or the above-mentioned metal elements; or $A_{2-x}(MF_6)$:Mn phosphor, wherein $0 < x \leq 1$, A is selected from a group consisting of potassium (K), rubidium (Rb) and cesium (Cs) or the above-mentioned metal elements, and M is selected from a group consisting of silicon (Si), germanium (Ge) and titanium (Ti) or the above-mentioned metal elements; or $MAlSiN_3$:Eu phosphor, M is selected from a group consisting of calcium (Ca), strontium (Sr) and barium (Ba) or the above-mentioned metal elements; or $M_xSi_{12-y-z}Al_{y+z}O_2N_{16-z}$:Eu phosphor, wherein $0 < x \leq 1$, $0 \leq y \leq 1$, $0 \leq z \leq 1$, M is selected from a group consisting of calcium (Ca), strontium (Sr), barium (Ba), magnesium (Mg), lithium (Li) and yttrium (Y) or the above-mentioned metal elements; or $(Ba_xSr_yCa_z)_2SiO_4$:Eu phosphor, $(Ba_xSr_yCa_z)_3SiO_5$:Eu phosphor, or $(Ba_xSr_yCa_z)_3SiO_5$:Ce, Li phosphor, $x+y+z=1$; measuring the emission intensity of the LED driven by a certain current and a first chromaticity coordinate of the LED; exciting the first fluorescent material and the second fluorescent material by the blue light, measuring a second chromaticity coordinate of the first fluorescent material and a third chromaticity coordinate of the second fluorescent material; setting a white light chromaticity coordinate, and obtaining a mix-light chromaticity coordinate of the first fluorescent material and the second fluorescent material according to the white light chromaticity coordinate, the first chromaticity coordinate, the second chromaticity coordinate and the third chromaticity coordinate; obtaining the emission intensity of the first fluorescent material and the emission intensity of the second fluorescent material according to the mix-light chromaticity coordinate, the second chromaticity coordinate and the third chromaticity coordinate; and determining the ratio of the weight of the first fluorescent material to the weight of the second fluorescent material according to the emission intensity of the first fluorescent material and the emission intensity of the second fluorescent material.

6. The manufacturing method according to claim 5, wherein when the first fluorescent material and the second fluorescent material are excited by a short-wavelength blue light, the excitation intensity of the first fluorescent material is higher than the excitation intensity of the second fluorescent material, and when the first fluorescent material and the second fluorescent material are excited by a long-wavelength blue light, the excitation intensity of the first fluorescent material is lower than the excitation intensity of the second fluorescent material, the peak wavelength of the emission of the first fluorescent material is smaller than the peak wavelength of the emission of the second fluorescent material, light the dividing wavelength between the short-wavelength blue light and the long-wavelength blue ranges from a first wavelength to a second wavelength.

7. The manufacturing method according to claim 6, wherein the first wavelength is approximately 440 nm, and the second wavelength is approximately 480 nm.

8. The manufacturing method according to claim 5, wherein when the LED is a nitride compound semiconductor, the dominant wavelength of the blue light generated by the LED ranges from 430 to 490 nm.

* * * * *